(12) United States Patent
Kim et al.

(10) Patent No.: US 10,491,237 B1
(45) Date of Patent: Nov. 26, 2019

(54) CONTINUOUS-TIME DELTA-SIGMA MODULATOR

(71) Applicant: KOREA UNIVERSITY RESEARCH AND BUSINESS FOUNDATION, Seoul (KR)

(72) Inventors: Chulwoo Kim, Seoul (KR); Chaekang Lim, Incheon (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/242,508

(22) Filed: Jan. 8, 2019

(30) Foreign Application Priority Data

Jun. 14, 2018 (KR) .................. 10-2018-0068451

(51) Int. Cl.
*H03M 1/12* (2006.01)
*H03M 3/00* (2006.01)

(52) U.S. Cl.
CPC ........... *H03M 3/504* (2013.01); *H03M 3/406* (2013.01); *H03M 3/422* (2013.01); *H03M 3/436* (2013.01)

(58) Field of Classification Search
CPC ...... H03M 3/504; H03M 3/422; H03M 3/406; H03M 3/436; H03M 1/12; H03M 3/30; H03M 3/50; H03M 7/3004
USPC .................................................. 341/143, 155
See application file for complete search history.

(56) References Cited

U.S. PATENT DOCUMENTS

| | | | | |
|---|---|---|---|---|
| 5,570,049 A * | 10/1996 | Chen | ..................... | H03F 1/3211 327/103 |
| 6,677,822 B2 * | 1/2004 | Hasegawa | ............... | H03F 3/343 327/552 |
| 7,400,190 B2 * | 7/2008 | Wang | .................. | H03H 11/1291 327/552 |
| 7,863,972 B2 * | 1/2011 | Wang | .................. | H03H 11/1291 327/552 |
| 9,838,031 B2 * | 12/2017 | Dong | ..................... | H03M 3/322 |
| 2002/0163384 A1 * | 11/2002 | Hasegawa | ............... | H03F 3/343 330/258 |
| 2005/0212566 A1 * | 9/2005 | Wilson | .................. | H03L 7/0891 327/105 |
| 2005/0242871 A1 * | 11/2005 | Wang | .................. | H03H 11/1291 327/552 |
| 2006/0077009 A1 * | 4/2006 | Christoffers | ............ | H03L 7/093 331/16 |
| 2007/0075777 A1 * | 4/2007 | Kim | ..................... | H03F 3/45197 330/259 |
| 2007/0146064 A1 * | 6/2007 | Morie | .................. | H03F 3/45475 327/563 |
| 2012/0188107 A1 * | 7/2012 | Ashburn, Jr. | ......... | H03M 3/344 341/110 |
| 2016/0242645 A1 * | 8/2016 | Muller | .................. | A61B 5/7203 |

* cited by examiner

*Primary Examiner* — Jean B Jeanglaude
(74) *Attorney, Agent, or Firm* — Hauptman Ham, LLP

(57) ABSTRACT

A continuous-time delta-sigma modulator includes a loop filter, a quantizer, a finite impulse response (FIR) filter, and a digital to analog converter. The loop filter integrates a difference between an input signal and a feedback signal. The quantizer quantizes a signal output from the loop filter to convert the quantized signal into a digital signal. The FIR filter performs an FIR filtering process on the digital signal output from the quantizer. The digital to analog converter converts a signal output from the FIR filter into an analog signal and outputs the converted analog signal as a feedback signal.

5 Claims, 13 Drawing Sheets

CONTINUOUS-TIME DELTA-SIGMA MODULATOR

CROSS-REFERENCE TO RELATED APPLICATIONS

This application claims the priority of Korean Patent Application No. 10-2018-0068451 filed on Jun. 14, 2018, in the Korean Intellectual Property Office, the disclosure of which is incorporated herein by reference.

BACKGROUND

Field

The present disclosure relates to a continuous-time delta-sigma modulator.

Description of the Related Art

A delta-sigma modulator is implemented by a discrete-time manner or a continuous-time manner. A delta-sigma modulator according to the discrete-time manner stores or transmits an input signal to a capacitor in the form of charges, based on a switched capacitor technique. The discrete-time delta-sigma modulator operates for the input signal in accordance with a sampling process, but a continuous-time delta-sigma modulator may operate for the input signal without performing a sampling process.

As compared with the discrete-time manner, according to the continuous-time manner, a design requirement of an amplifier used for an integrator is low so that a low power and high speed operation of the delta-sigma modulator is allowed. In the continuous-time delta-sigma modulator, the integrator does not perform a sampling operation so that an effect of an anti-aliasing filter may be achieved.

The continuous-time delta-sigma modulator may be used for various wireless communication systems such as a 3rd generation partnership project (3GPP), long term evolution (LTE), and worldwide interoperability for microwave access (WiMax), according to a characteristic of a high signal-to-noise ratio (hereinafter, abbreviated as SNR).

A front-end of a continuous-time delta-sigma modulator (CTDSM) of the related art may be implemented as illustrated in FIG. 1A and FIG. 1B. In order to implement a loop filter of the continuous-time delta-sigma modulator of the related art, an integrator is necessary. In the case of a loop filter using a Gm-C integrator, due to a characteristic of an open loop, an input node of an amplifier is not caught as a virtual ground, so that it is difficult to obtain a broad input voltage range and a good linearity. Further, when the Gm-C integrator is used, an input voltage of the modulator and an output of a digital to analog converter are subtracted from an output terminal of the integrator. This may limit an input range and the linearity of the continuous-time delta-sigma modulator. In other words, when the Gm-C integrator is used for the loop filter, an input range of the modulator becomes equal to an input range of the integrator so that the input range of the modulator is limited by the input of the integrator and the linearity of the modulator is limited by the linearity of the integrator. For example, when an input range of the integrator is 0.3 Vpp and a linearity is 50 dB, the input range of the modulator may not be larger than 0.3 Vpp and the linearity of the modulator may not be higher than 50 dB.

Therefore, it is demanded to develop a technology for a continuous-time delta-sigma modulator in which a linearity of the entire modulator is not limited by the linearity of the integrator and an input range of the entire modulator is not limited by the input range of the integrator.

SUMMARY

An object to be achieved by the present disclosure is to provide a continuous-time delta-sigma modulator in which a linearity of the entire modulator is not limited by a linearity problem of the integrator and an input range of the entire modulator is not limited by the input range of the integrator.

Another object to be achieved by the present disclosure is to provide a continuous-time delta-sigma modulator which is capable of removing an aliasing error caused by a parasitic capacitor generated in a chopper circuit.

Technical objects of the present disclosure are not limited to the aforementioned technical objects and other technical objects which are not mentioned will be apparently appreciated by those skilled in the art from the following description.

According to an aspect of the present disclosure, a continuous-time delta-sigma modulator includes: a loop filter which integrates a difference between an input signal and a feedback signal; a quantizer which quantizes a signal output from the loop filter to convert the quantized signal into a digital signal; a finite impulse response (FIR) filter which performs an FIR filtering process on the digital signal output from the quantizer; and a digital to analog converter which converts a signal output from the FIR filter into an analog signal and outputs the converted analog signal as a feedback signal.

Desirably, the loop filter is implemented by at least one Gm-C integrator, and the Gm-C integrator includes a transconductor which generates differential output currents through a plus output terminal and a minus output terminal in accordance with a difference of input voltages input to a plus input terminal and a minus input terminal and first and second capacitors which receive the differential output current to charge charges and generate an integrated voltage.

Desirably, the continuous-time delta-sigma modulator may further include a chopper circuit which is located at a front-end or a rear-end of the transconductor and removes a low frequency noise of the Gm-C integrator.

Desirably, the chopper circuit may set an aliasing error frequency as a notch frequency of the FIR filter.

Desirably, the continuous-time delta-sigma modulator may further include: an adder which adds the difference between the modulator input signal and the feedback signal to output the added value to the loop filter.

According to another aspect of the present disclosure, a loop filter includes: a transconductor Gm which converts a difference of input voltages input to two differential input terminals Vinp and Vinn into a current and outputs the current; first and second capacitors C which accumulate charges by a current output from the transconductor; and a chopper circuit which is located at a front-end or a rear-end of the transconductor and removes a low frequency noise.

A continuous-time delta-sigma modulator according to the present disclosure subtracts a feedback signal of a digital to analog converter from an input signal of the modulator and applies the difference to the integrator so that the input range of the integrator does not limit the input range of the entire modulator and the linearity of the integrator does not limit the linearity of the entire modulator.

Further, according to the present disclosure, an FIR filter is used so that an input range of the modulator is increased and an aliasing error due to the parasitic capacitor generated in a chopper circuit may be removed.

The effects of the present disclosure are not limited to the technical effects mentioned above, and other effects which are not mentioned can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1A:
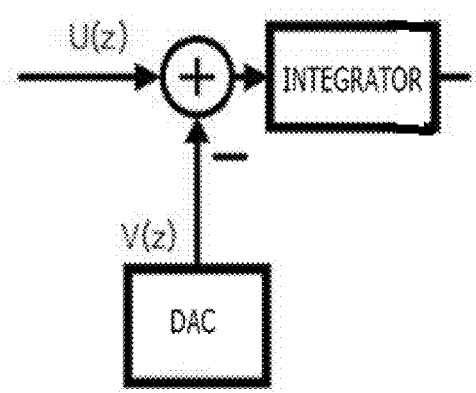
FIG. 1A and FIG. 1B are a view for explaining a front-end of a continuous-time delta-sigma modulator of the related art.
Figure 1B:
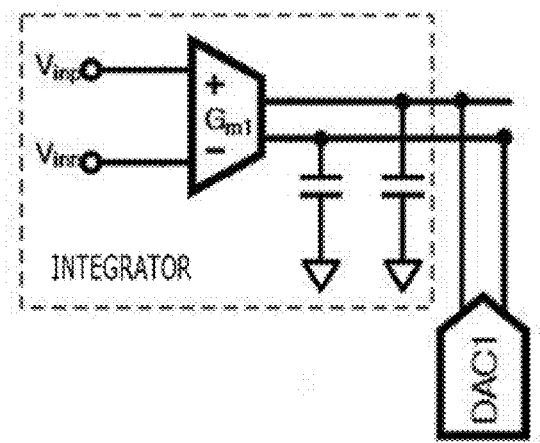

Hereinafter, exemplary embodiments of the present disclosure will be described more fully with reference to the accompanying drawings for those skilled in the art to easily implement the present invention. As those skilled in the art would realize, the described embodiments may be modified in various different ways, all without departing from the spirit or scope of the present invention. The present invention is not limited to the embodiments described herein.

Accordingly, the drawings and description are to be regarded as illustrative in nature and not restrictive. In order to clearly illustrate the present invention, parts not related to the description are omitted. Like reference numerals designate like elements throughout the specification. Therefore, reference numerals which are used in previous drawings may be used for another drawing.

The size and thickness of the components shown the drawings are optionally determined for better understanding and ease of description, and the present invention is not limited to the examples shown in the drawings. In the drawings, thicknesses of several layers and regions are enlarged for clear expressions.

Figure 2:
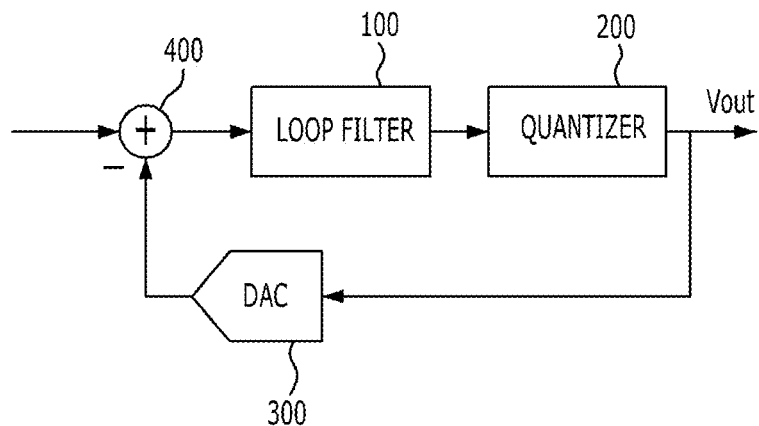
FIG. 2 is a view for explaining a continuous-time delta-sigma modulator according to an exemplary embodiment of the present disclosure.
Figure 3A:
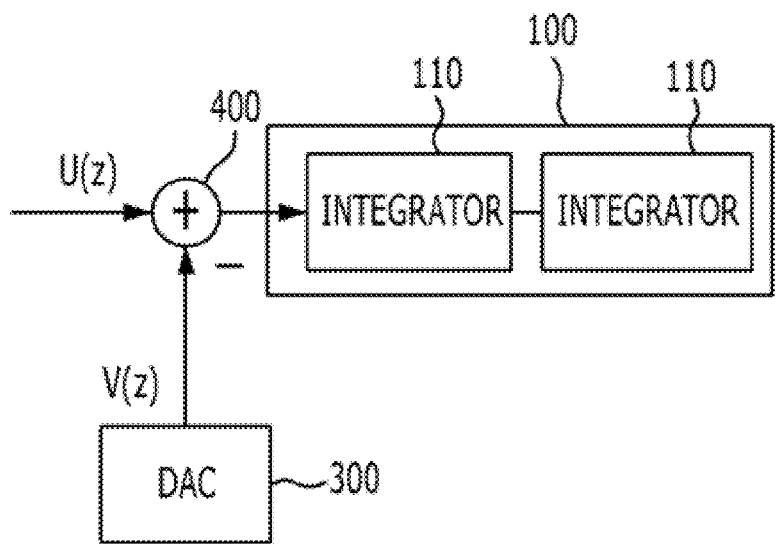
FIG. 3A and FIG. 3B are a view for explaining a front-end of a continuous-time delta-sigma modulator according to an exemplary embodiment of the present disclosure.
Figure 3B:
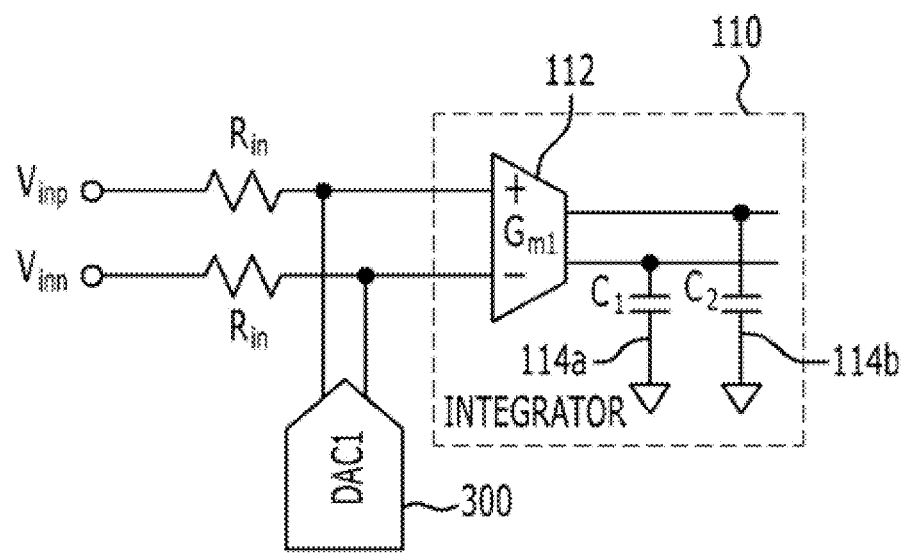

FIG. 2 is a view for explaining a continuous-time delta-sigma modulator according to an exemplary embodiment of the present disclosure and FIG. 3A and FIG. 3B are a view for explaining a front-end of a continuous-time delta-sigma modulator according to an exemplary embodiment of the present disclosure.

Referring to FIG. 2, a continuous-time delta-sigma modulator according to an exemplary embodiment of the present disclosure includes a loop filter 100, a quantizer 200, and a digital to analog converter 300.

The loop filter 100 integrates a difference between a modulator input signal U(z) and a feedback signal (analog signal) V(z) output from a digital to analog converter. In this case, the difference between the modulator input signal U(z) and the feedback signal (analog signal) may be added by an adder 400. That is, the modulator input signal and the feedback signal (analog signal) are input to the adder 400 and the adder 400 inputs a sum of the differences between two signals to the loop filter 100.

As illustrated in FIG. 3A and FIG. 3B, the loop filter 100 may include at least one integrator 110 and performs an integral operation. The loop filter 100 may be configured by multi-order integrators such as first, second, and third order integrators. In this case, the integrator 110 may be a Gm-C integrator and the Gm-C integrator 110 may be implemented by a transconductor Gm 112 and a capacitor 114. That is, the integrator 110 includes the transconductor Gm 112 which converts a difference of input voltages input to two differential input ends Vinp and Vinn into a current and outputs the current and a first capacitor C1 114a and a second capacitor C2 114b which accumulate charges by the current output from the transconductor 112. Specifically, the transconductor 112 generates differential output currents through a plus output terminal and a minus output terminal in accordance with a difference of input voltages input to a plus input terminal and a minus input terminal. That is, the transconductor 112 receives a voltage as an input and transmits a current as an output. The first capacitor C1 114a and the second capacitor C2 114b receive differential output currents from the transconductor 112 to charge the charges and generate an integral voltage.

As described above, the Gm-C integrator 110 subtracts an output (feedback signal) of the digital to analog converter 300 from an input signal at a front-end of the integrator 110, without using a virtual ground. In this case, the subtracting method may be performed by implementing the digital to analog converter 300 as a resistive type or a current type. An operation is performed using the input resistance and an output voltage difference of the digital to analog converter 300 and it serves as an input voltage Vx of the transconductor.

The quantizer 200 quantizes the signal output from the loop filter 100 and converts the quantized signal into a digital signal. That is, the quantizer 200 receives the output of the loop filter 100 and compares the output and a reference signal to output digital signals which are quantized to be low and high. For example, the quantizer 200 may be formed of a comparator which receives an output of the loop filter 100 and compares the output and the reference signal to output a digital signal. For example, the quantizer 200 may be an 1-bit, 2-bit, or multi-bit quantizer.

Further, the quantizer 200 may convert an analog signal to be input into a digital signal to output a quantized signal including a quantizing noise signal E.

The DAC 300 converts a signal output from the quantizer 200 into an analog form and outputs the converted analog signal as a feedback signal. That is, the DAC 300 receives a digital signal Vout and converts the received digital signal Vout into an analog signal in response to an external clock signal. Thereafter, the DAC 300 transmits the converted analog signal to the adder 400 as a feedback signal.

The continuous-time delta-sigma modulator with this structure may be a negative feedback structure which subtracts a feedback signal output from the DAC 300 from the input signal through the adder 400.

The continuous-time delta-sigma modulator with the above-described structure subtracts the feedback signal of the DAC 300 from a modulator input signal at a front-end of the integrator 110. In other words, a difference between the input signal of the modulator and the feedback signal output from the DAC 300 enters an input of the first integrator 110. Therefore, the input range of the continuous-time delta-sigma modulator is not directly limited by the input range of the integrator 110 and may have a broader input range.

An input node of the integrator 110 according to the present disclosure may be represented by a transfer function equation as expressed in Equation 1.

$$U(z)-V(z)=-E(z)\text{NTF}(z)+U(z)(1-\text{STF}(z)) \quad \text{[Equation 1]}$$

Here, U(z) is an input voltage of a modulator, V(z) is a feedback voltage output from a DAC, E(z) is a noise generated in a quantizer, NTF(z) is a noise transfer function (NTF), and STF(z) is a signal transfer function (STF).

It is understood from Equation 1 that a size of a signal to be processed by a transconductor Gm (integrator) is reduced from U(z) to U(z)−V(z).

Since STF(z) is "1" in Inband, when "1" is applied to STF(z) in Equation 1, a transfer function equation of the integrator input node may be represented by Equation 2.

$$U(z)-V(z) \approx -E(z)\text{NTF}(z) \quad \text{[Equation 2]}$$

Referring to Equation 2, it is understood that only the shaped quantized noise E(z)NTF(z) is applied to an input of the integrator 110. By doing this, it is understood that the linearity of the modulator is not limited by the linearity of the integrator and the input range of the modulator is not limited by the input range of the integrator.

Therefore, in the delta-sigma modulator according to the exemplary embodiment of the present disclosure, a difference between the input signal of the modulator and the feedback signal output from the DAC 300 is applied to the integrator 110, so that the linearity of the modulator is not limited by the linearity of the first integrator.

Figure 4:
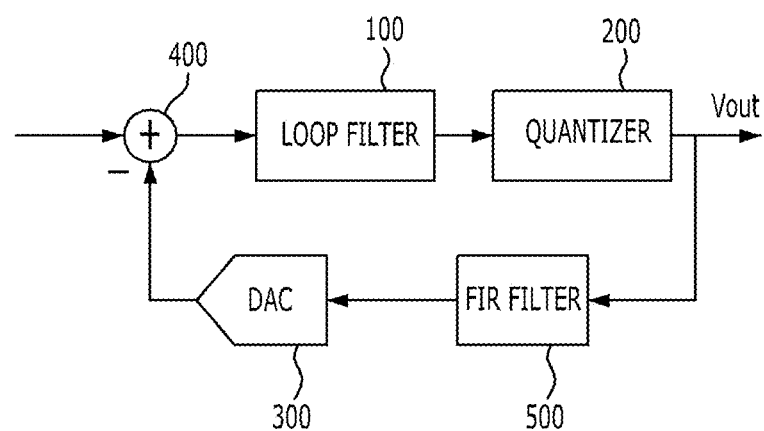
FIG. 4 is a view illustrating a continuous-time delta-sigma modulator according to another exemplary embodiment of the present disclosure.
Figure 5A:
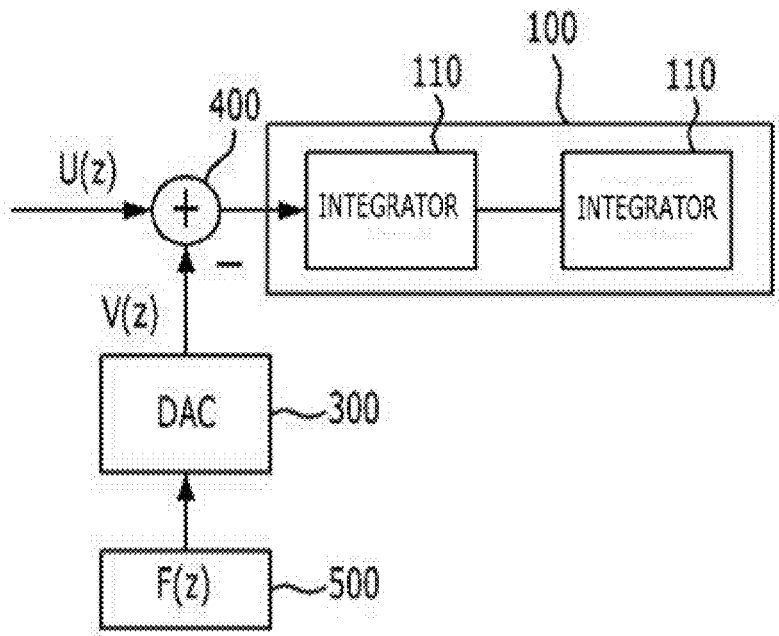
FIG. 5A and FIG. 5B are a view for explaining a front-end of a continuous-time delta-sigma modulator according to another exemplary embodiment of the present disclosure.
Figure 5B:
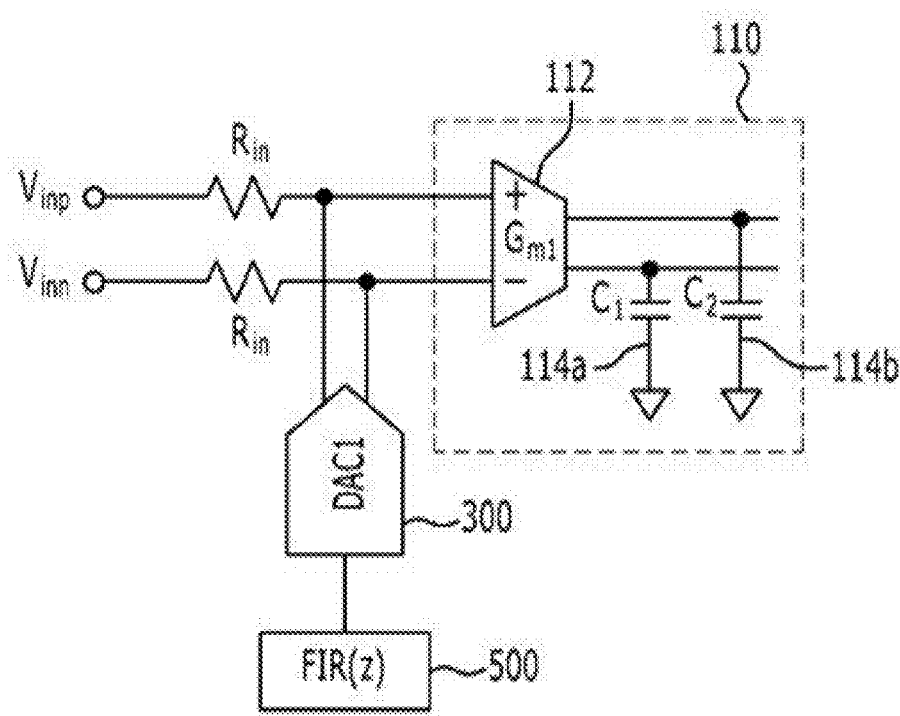
Figure 6A:
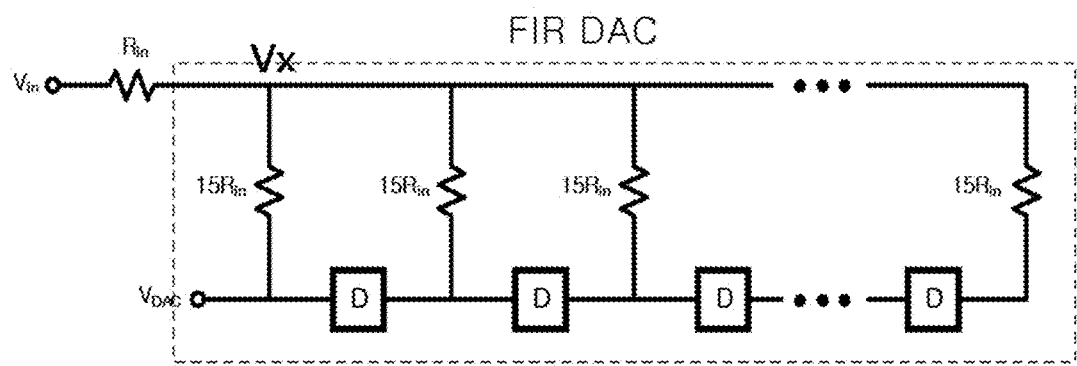
FIG. 6A and FIG. 6B are an example of a 15 tap FIR digital to analog converter according to another exemplary embodiment of the present disclosure.
Figure 6B:
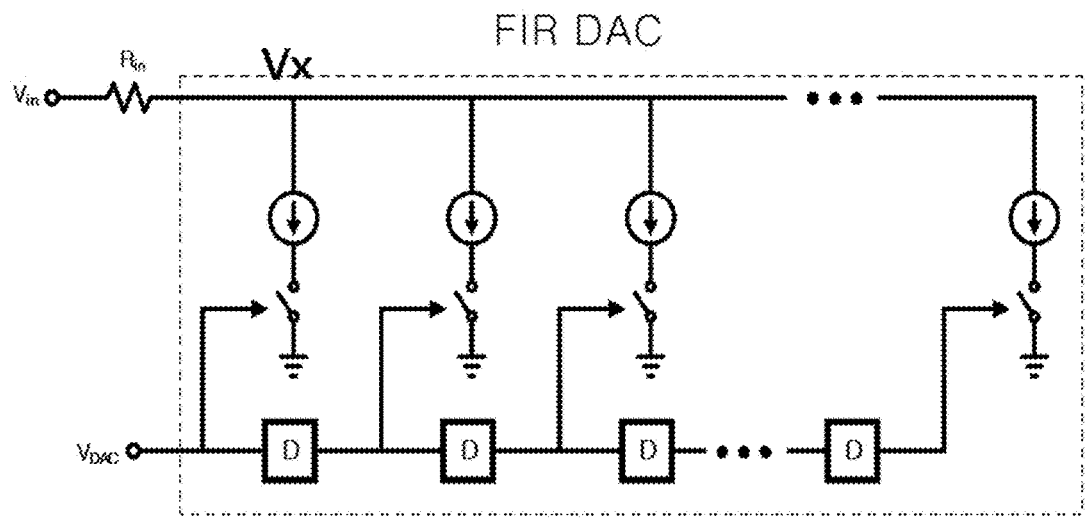

FIG. 4 is a view illustrating a continuous-time delta-sigma modulator according to another exemplary embodiment of the present disclosure, FIG. 5A and FIG. 5B are a view for explaining a front-end of a continuous-time delta-sigma modulator according to another exemplary embodiment of the present disclosure, and FIG. 6A and FIG. 6B are an example of a 15 tap FIR digital-analog converter according to another exemplary embodiment of the present disclosure.

Referring to FIG. 4, FIG. 5A and FIG. 5B, a continuous-time delta-sigma modulator according to another exemplary embodiment of the present disclosure includes an adder 400, a loop filter 100, a quantizer 200, an FIR filter (finite impulse response filter) 500, and a DAC 300.

Since the adder 400, the loop filter 100, the quantizer 200 perform the same operations as the adder 400, the loop filter 100, and the quantizer 200 illustrated in FIG. 2, so that a detailed description will be omitted.

The FIR filter 500 performs the FIR filtering process on a digital signal output from the quantizer 200.

The DAC 300 converts a signal output from the FIR filter 500 into an analog signal and outputs the converted analog signal as a feedback signal. That is, the DAC 300 receives the FIR filtered digital signal from the FIR filter 500 and converts the received digital signal into an analog signal in response to the external clock signal. Thereafter, the DAC 300 transmits the converted analog signal to the adder 400 as a feedback signal. In this case, the feedback signal may be represented by Equation 3.

$$V(z)=E(z)\text{NTF}(z)+U(z)\text{STF}(z) \quad \text{[Equation 3]}$$

The feedback signal as represented in Equation 3 is configured by a signal E(z)NTF(z) formed by a high-pass shaped quantizing noise and an input signal component U(z)STF(z). An input node of the first integrator by the feedback signal may be represented by a transfer function equation as expressed in Equation 4.

$$U(z)-V(z)F(z)=-E(z)\text{NTF}(z)F(z)+U(z)(1-\text{STF}(z)) \quad \text{[Equation 4]}$$

Here, F(z) may be a transfer function of the FIR filter.

Since STF(z) is "1" in Inband, when "1" is applied to STF(z) in Equation 4, a transfer function equation of the integrator input node may be represented by Equation 5.

$$U(z)-V(z)F(z) \approx -E(z)\text{NTF}(z)F(z) \quad \text{[Equation 5]}$$

Referring to Equation 5, it is understood that only the shaped quantized noise E(z)NTF(z) passes through the FIR filter F(z) and then is applied to an input of the integrator 110.

Figure 8A:
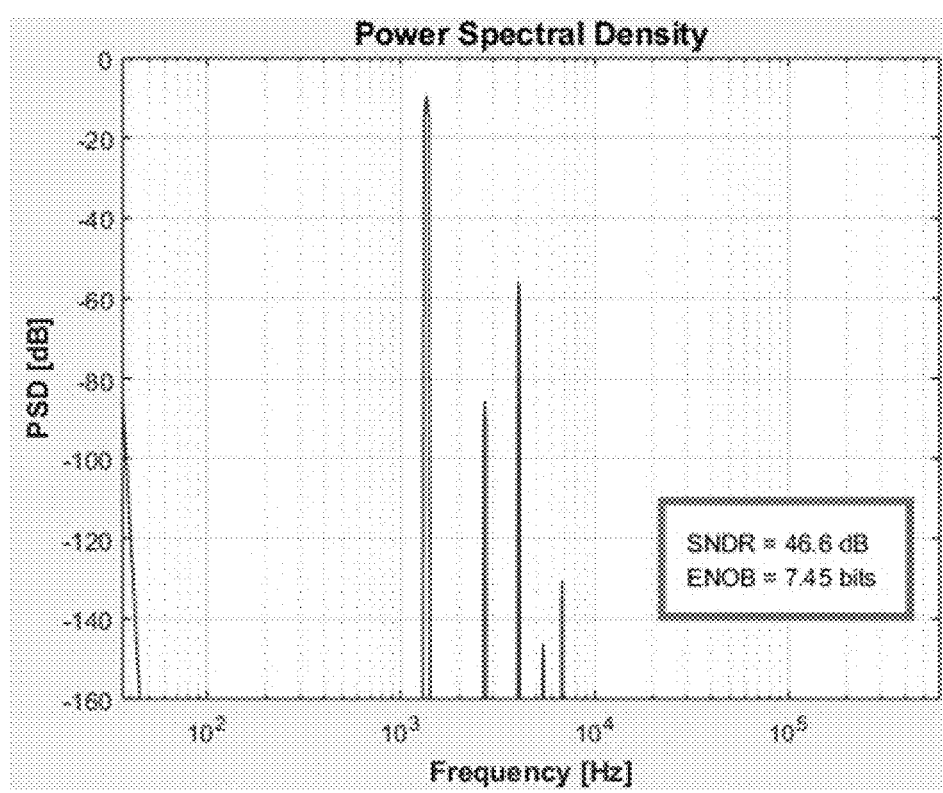
FIG. 8A and FIG. 8B are a graph for comparing linearities of a continuous-time delta-sigma modulator of the related art and a continuous-time delta-sigma modulator according to an exemplary embodiment of the present disclosure.
Figure 8B:
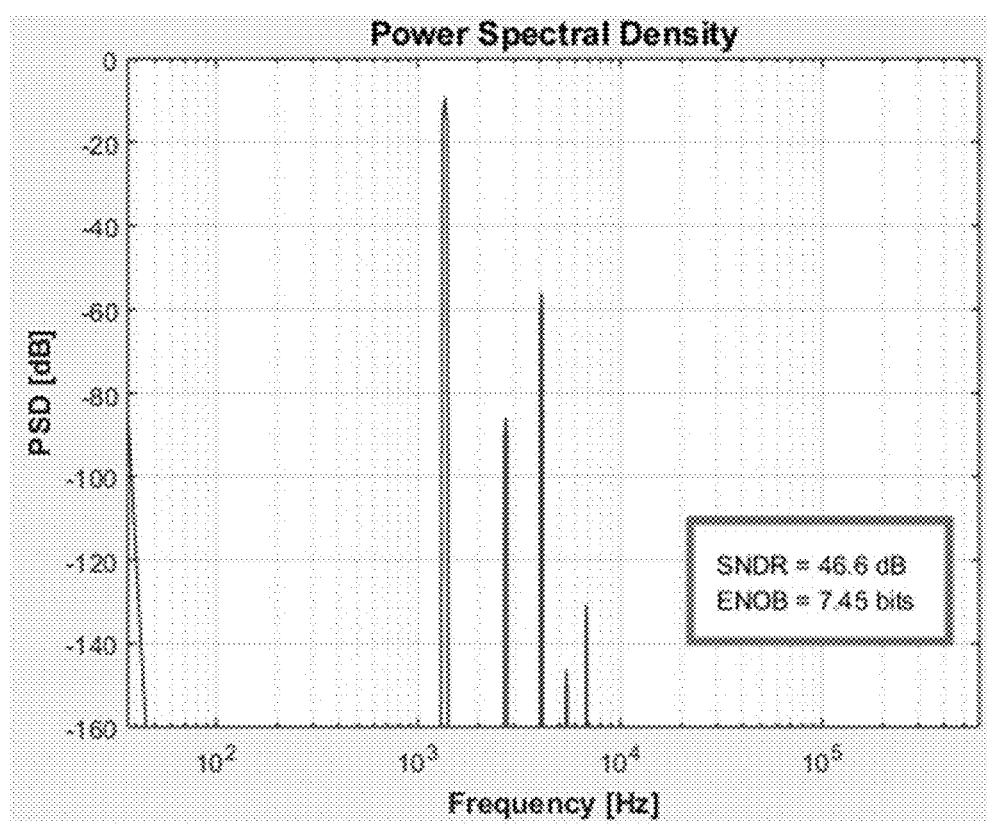

It is confirmed that in the delta-sigma modulator according to the present disclosure, as illustrated in FIG. 8A and FIG. 8B, a high-pass shaped component passes through the FIR filter to be low-pass filtered. Therefore, it is possible to calculate a range of the input signal varying depending on whether an FIR filter is provided. Two delta-sigma modulators are assumed such that one is a delta-sigma modulator which does not include an FIR filter and the other one is a delta-sigma modulator which includes an FIR filter. When a first integrator of each delta-sigma modulator has the same input signal magnitude, a relationship as represented in Equation 6 may be established.

$$U_2(z)-V(z)F(z)=U_1(z)-V(z)$$

$$U_2(z)-U_1(z)=[F(z)-1]V(z) \quad \text{[Equation 6]}$$

Here, $U_1(z)$ is an input voltage of an integrator of a delta-sigma modulator which does not include an FIR filter and $U_2(z)$ is an input voltage of an integrator of a delta-sigma modulator to which an FIR filter is applied. $U_2(z)-V(z)F(z)$ is an input node signal of an integrator of a continuous-time delta-sigma modulator to which the FIR DAC is applied, $U_1(z)-V(z)$ is an input node signal of an integrator of a continuous-time delta-sigma modulator which does not include the FIR DAC, and $U_2(z)-U_1(z)=[F(z)-1]V(z)$ is an input range of a modulator increasing when the FIR filter is applied.

Referring to Equation 6, it is understood that the FIR DAC is applied, the input signal range of the continuous-time delta-sigma modulator is increased by $[F(z)-1]V(z)$.

In the meantime, the Gm-C integrator 110 of the present disclosure subtracts an output (feedback signal) of the digital to analog converter 300 from an input signal at a front-end of the integrator 110, without using a virtual ground. In this case, the subtracting method may be performed by implementing the digital to analog converter 300 as a resistive type as illustrated in FIG. 6A or a current type as illustrated in FIG. 6B. An operation is performed using the input resistance and an output voltage difference of the digital to analog converter 300 and it serves as an input voltage Vx of the transconductor.

Figure 7:
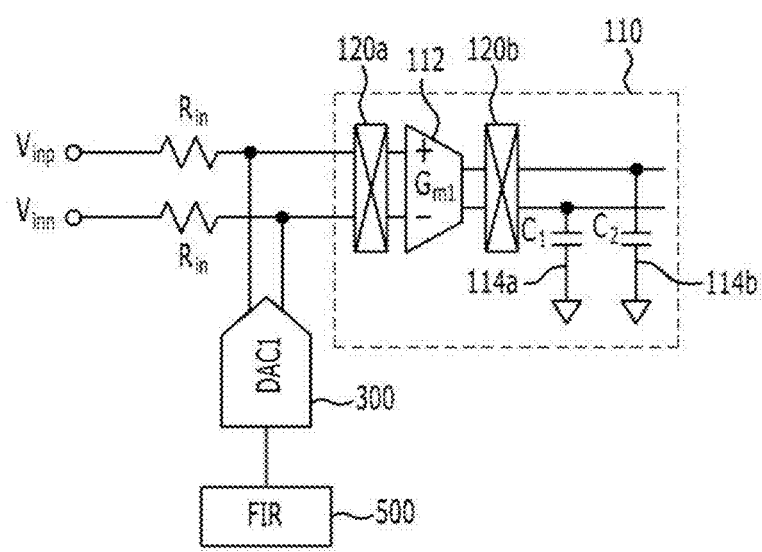
FIG. 7 is a view for explaining a front-end of a continuous-time delta-sigma modulator according to still another exemplary embodiment of the present disclosure.

FIG. 7 is a view for explaining a front-end of a continuous-time delta-sigma modulator according to still another exemplary embodiment of the present disclosure.

Referring to FIG. 7, a continuous-time delta-sigma modulator according to still another exemplary embodiment of the present disclosure includes an adder, a loop filter, a quantizer, an FIR filter, and a DAC in which the adder, the quantizer, the FIR filter, and the DAC are the same as illustrated in FIG. 4 and the loop filter 100 may further include a chopper circuit 120 which removes a low frequency noise of the integrator 110.

The chopper circuit 120 is located at a front-end or a rear-end of the transconductor and removes a low frequency noise of the Gm-C integrator 110. In this case, the chopper circuit 120 may set an aliasing error frequency component as a notch frequency of the FIR filter 500. That is, the aliasing error generated in the chopper circuit 120 may reduce a signal-to-noise ratio (SNR) of the entire modulator. Therefore, the error component may be significantly reduced by disposing an aliasing error frequency component at a notch frequency of the FIR filter 500.

For example, when it is assumed that a sampling frequency of the modulator is Fs, the number of taps of the FIR filter 500 is N, and a chopper frequency is Fchop, notches of the FIR filter 500 may be present in a frequency component of Fs such as Fs/N, 2*Fs/N, and 3*Fs/N. In this case, the frequency may be unified by 2Fchop=Fs/N. The frequency component reduced by the notch of the FIR filter 500 is aliased by the chopper circuit 120. As a result, the FIR filter 500 is used to reduce the chopper error.

The chopper circuit 120 includes a first chopper circuit 120a located at the front-end of the transconductor 112 and a second chopper circuit 120b located at the rear-end of the transconductor 112.

The first chopper circuit 120a receives a difference between the modulator input signal and the feedback signal and modulates the difference signal by chopping the difference signal by a predetermined chopper frequency Fchop. In this case, since 2Fchop=Fs/N, the chopper frequency Fchop may be 1/(2N) times (here, N is one or larger natural number) the sampling frequency Fs. In specific modifications, the chopping frequency is a half the sampling frequency by considering a chopper frequency which is the highest at the given sampling frequency.

The first chopper circuit 120a modulates the difference signal of the modulator input signal and the feedback signal using the chopper modulation signal having the chopper frequency to be moved to a chopper frequency band of a desired baseband signal. In this case, the chopper frequency fchop needs to be set to be higher than a frequency of a bandwidth fband which performs band-filtering on the received difference signal.

In the meantime, the signal output from the first chopper circuit 120a is a signal in which a spectrum is shifted by an odd-numbered harmonic of the chopper frequency fchop.

The transconductor 112 filters and amplifies only a signal of the chopper frequency Fchop among odd-numbered harmonic frequency spectra generated in the first chopper circuit 120a. That is, the transconductor 112 amplifies a chopper frequency Fchop in a frequency band which is not affected by a 1/f noise so that sensitivity degradation due to the 1/f noise may be minimized.

The second chopper circuit 120b shifts the signal amplified in the transconductor 112 to a baseband and in this case, the 1/f noise is shifted to the chopper frequency. A signal output from the second chopper circuit 120b is obtained by amplifying a desired baseband signal without being affected by the 1/f noise.

According to the present disclosure, a desired baseband signal is moved to a chopper frequency band and then amplified using the first chopper circuit 120a, and then the amplified signal is converted to the baseband using the second chopper circuit 120b so that only a desired signal may be selectively amplified without being affected by the 1/f noise. Therefore, a sensitivity degradation of the device due to the 1/f noise may be minimized.

Figure 9A:
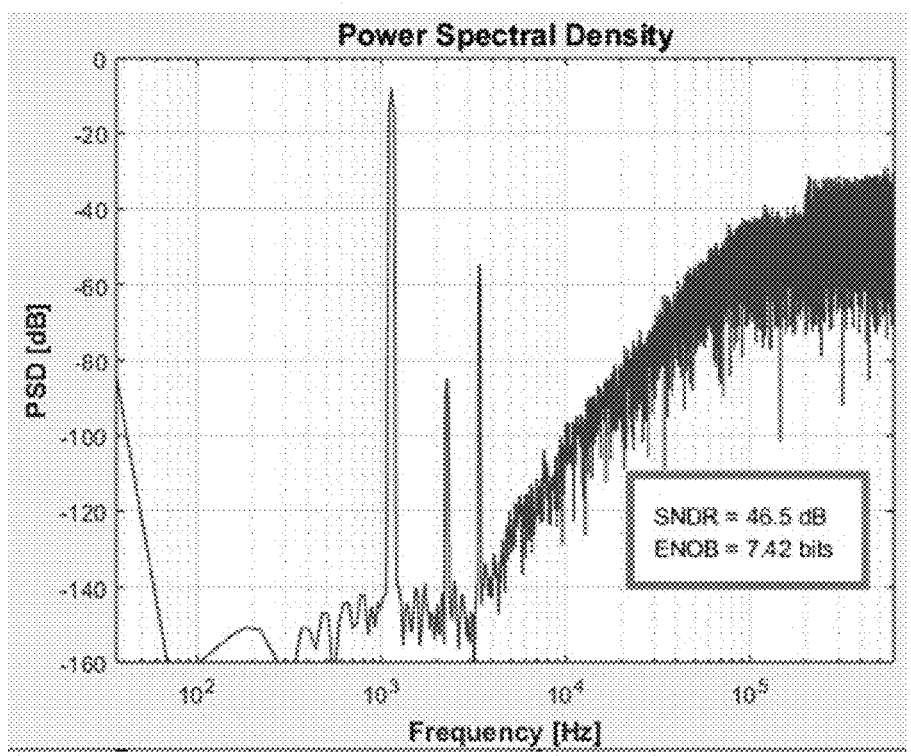
FIG. 9A and FIG. 9B are a graph for comparing output spectra of a continuous-time delta-sigma modulator of the related art and a continuous-time delta-sigma modulator according to an exemplary embodiment of the present disclosure.
Figure 9B:
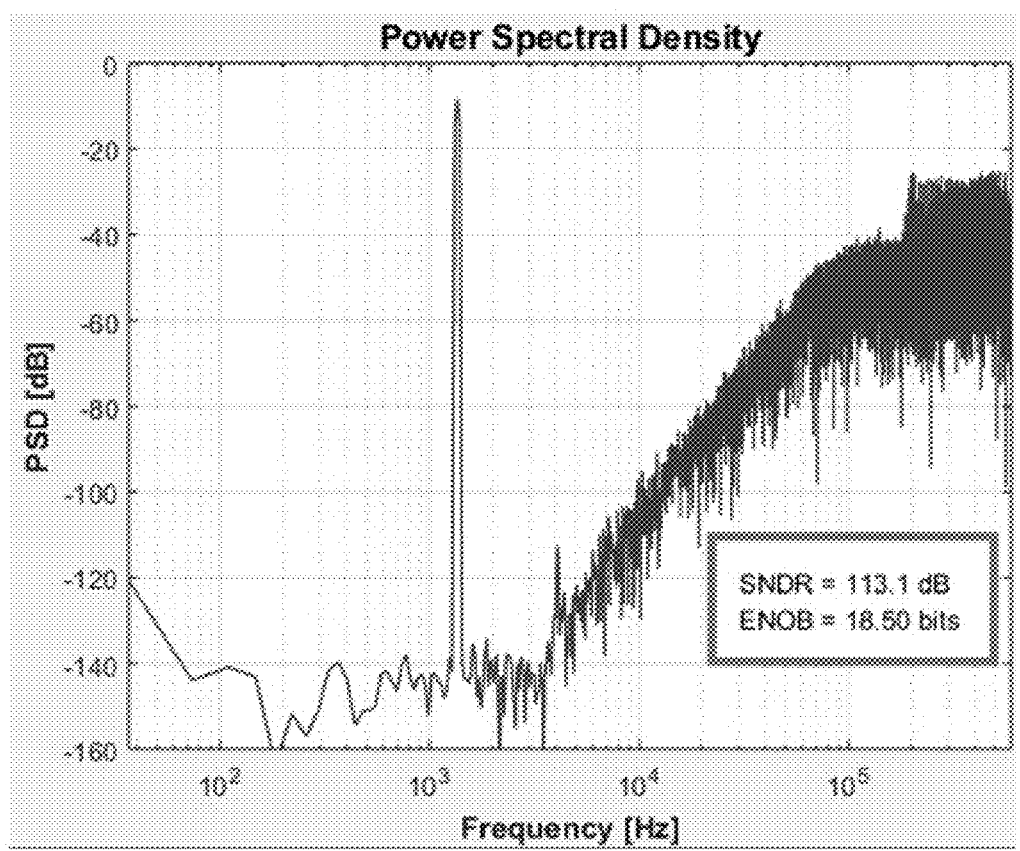

FIG. 8A and FIG. 8B are a graph for comparing linearities of a continuous-time delta-sigma modulator of the related art and a continuous-time delta-sigma modulator according to an exemplary embodiment of the present disclosure and FIG. 9A and FIG. 9B are a graph for comparing output spectra of a continuous-time delta-sigma modulator of the related art and a continuous-time delta-sigma modulator according to an exemplary embodiment of the present disclosure.

Referring to FIGS. 8A, 8B, 9A and 9B, it is confirmed that a continuous-time delta-sigma according to the present disclosure subtracts a feedback signal of a digital to analog converter from an input signal of the modulator and applies the difference to the integrator so that the input range of the integrator does not limit the input range of the entire modulator and the linearity of the integrator does not limit the linearity of the entire modulator.

Figure 10A:
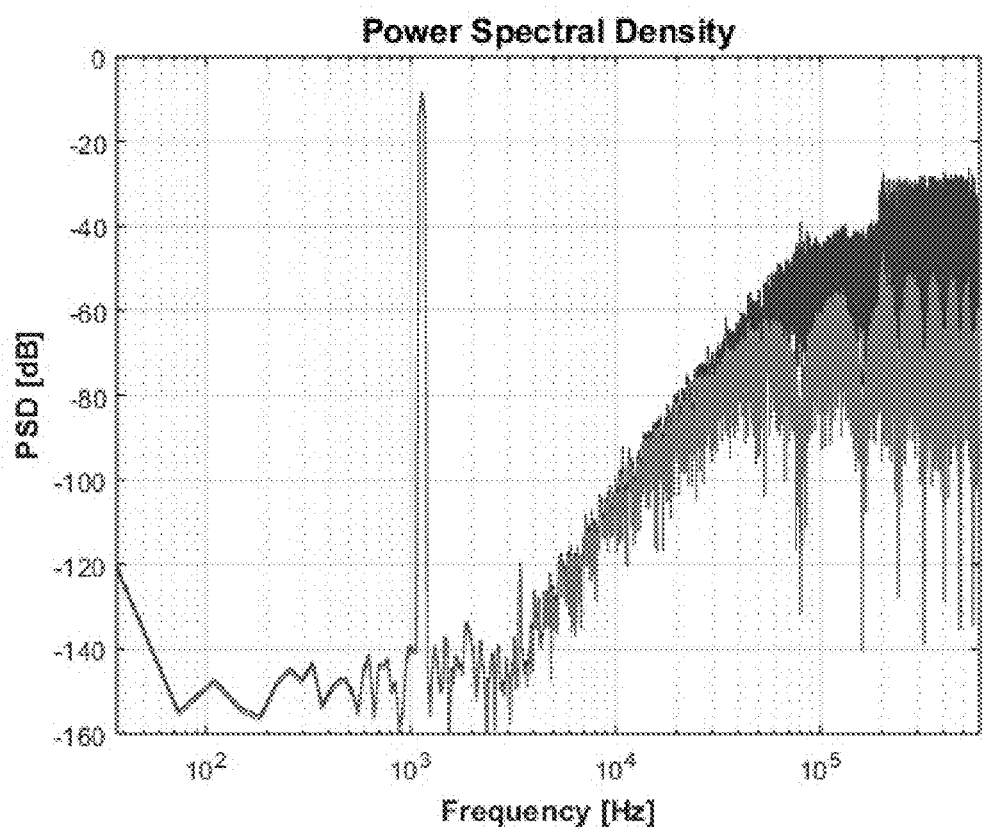
FIG. 10A and FIG. 10B are a view for explaining an effect of a continuous-time delta-sigma modulator equipped with an FIR filter according to another exemplary embodiment of the present disclosure.
Figure 10B:
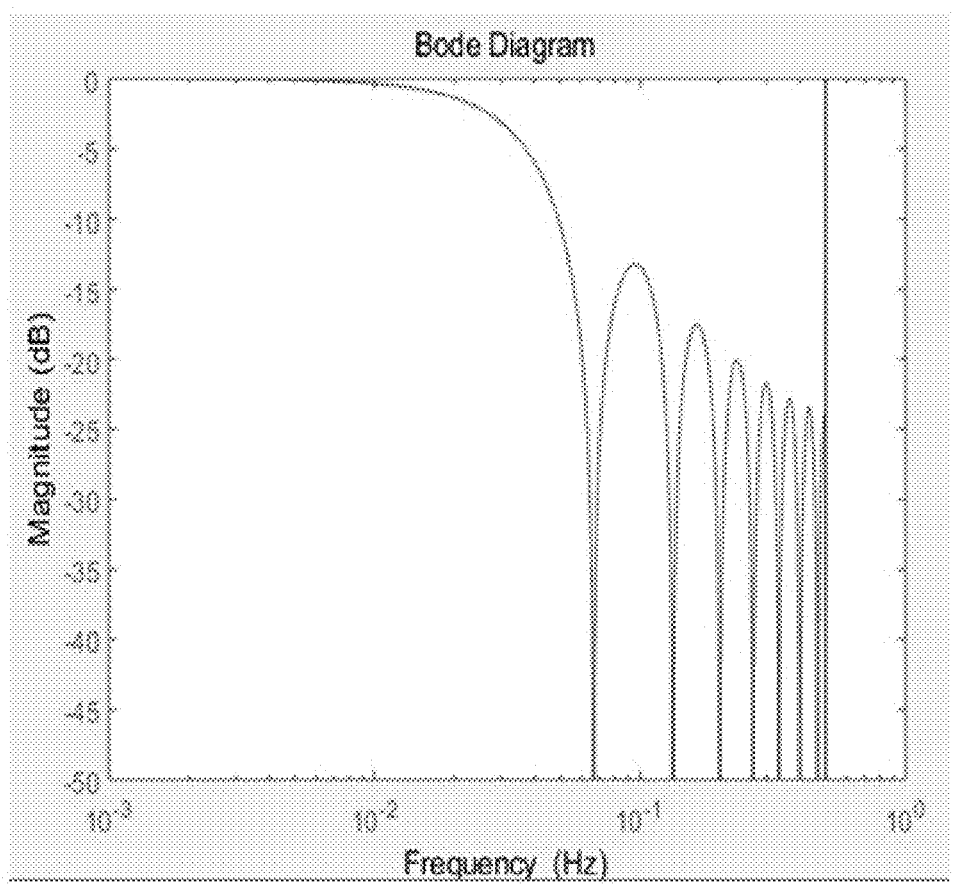

FIG. 10A and FIG. 10B are a view for explaining an effect of a continuous-time delta-sigma modulator equipped with an FIR filter according to another exemplary embodiment of the present disclosure.

FIG. 10A is a spectrum after and before passing through the FIR DAC and FIG. 10B is an exemplary view illustrating a notch of a 15 tap FIR filter.

Referring to FIG. 10A and FIG. 10B, it is confirmed that a high-pass shaped component passes through the FIR filter to be low-pass filtered again. Further, referring to Equation 6, it is understood that the input range of the modulator is increased by an energy difference of blue and red spectra of FIG. 9A and FIG. 9B.

Figure 11:
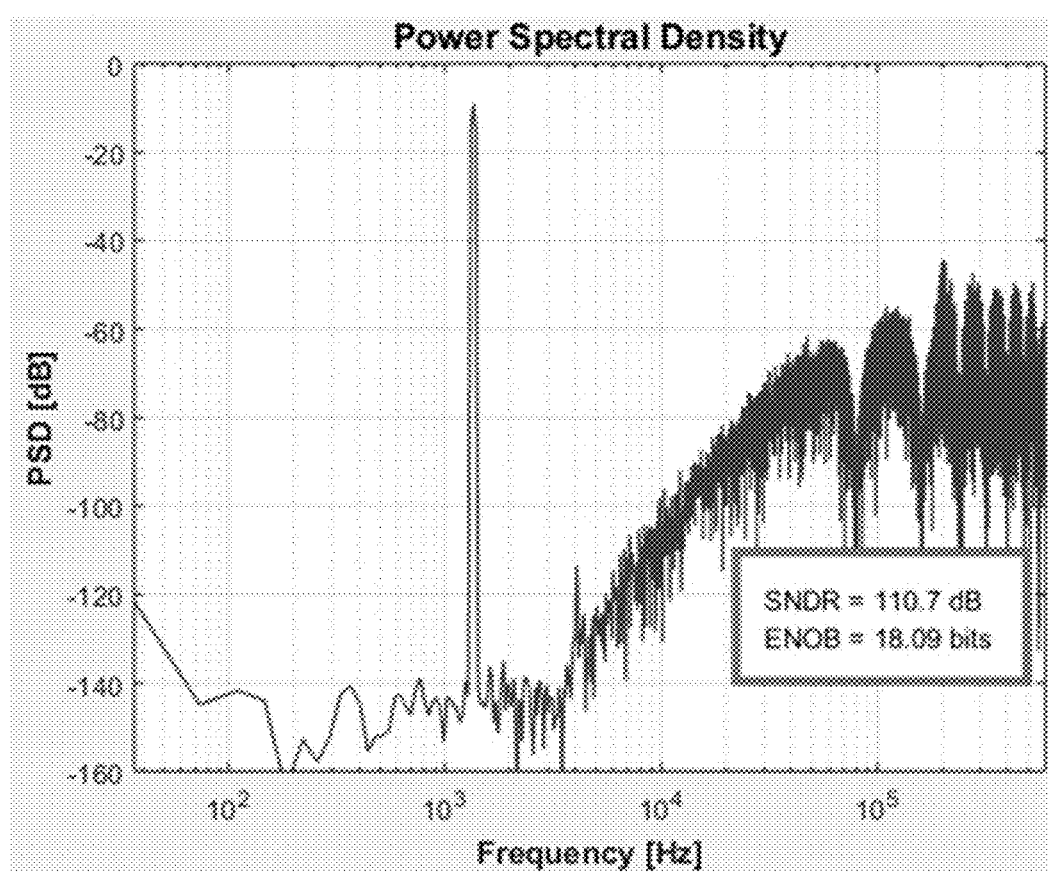
FIG. 11 is a graph illustrating an output spectrum of a digital to analog converter when a chopper circuit according to another exemplary embodiment of the present disclosure is added.

FIG. 11 is a graph illustrating an output spectrum of a digital to analog converter when a chopper circuit according to another exemplary embodiment of the present disclosure is added.

Referring to FIG. 11, the chopper circuit is used to remove a low frequency noise of the integrator. That is, the aliasing error generated in the chopper circuit may reduce a signal-to-noise ratio (SNR) of the entire modulator. Therefore, it is confirmed that the input range of the modulator is increased using the FIR filter and the aliasing error due to a parasitic capacitor generated in the chopper circuit is removed by disposing the chopper frequency at a notch of FIG. 11.

The referenced drawings and described detailed description of the present invention are merely exemplary of the present disclosure, which are used for the purpose of merely describing the present invention, not limiting the scope of the present disclosure which is included in the appended claims. Therefore, it will be appreciated to those skilled in the art that various modifications are made and other equivalent embodiments are available. Accordingly, the actual scope of the present disclosure must be determined by the technical spirit of the appended claims.

What is claimed is:

1. A continuous-time delta-sigma modulator, comprising:
a loop filter which integrates a difference between an input signal and a feedback signal;
a quantizer which quantizes a signal output from the loop filter to convert the quantized signal into a digital signal;
a finite impulse response (FIR) filter which performs a FIR filtering process on the digital signal output from the quantizer; and
a digital to analog converter which converts a signal output from the FIR filter into an analog signal and outputs the converted analog signal as a feedback signal,
wherein the loop filter is implemented by at least one Gm-C integrator, and
wherein the at least one Gm-C integrator includes:
a transconductor which generates differential output currents through a plus output terminal and a minus output terminal in accordance with a difference of input voltages input to a plus input terminal and a minus input terminal; and
first and second capacitors which receive the differential output current to charge charges and generate an integrated voltage.

2. The continuous-time delta-sigma modulator according to claim 1, further comprising:
an adder which adds the difference between the modulator input signal and the feedback signal to output the added value to the loop filter.

3. The continuous-time delta-sigma modulator according to claim 1, further comprising:
a chopper circuit which is located at a front-end or a rear-end of the transconductor and removes a low frequency noise of the Gm-C integrator.

4. The continuous-time delta-sigma modulator according to claim 3, wherein the chopper circuit sets an aliasing error frequency component as a notch frequency of the FIR filter.

5. A loop circuit, comprising:
a transconductor which converts a difference of input voltages input to two differential input terminals(Vinp, Vinn) into a current and outputs the current;
first and second capacitors which accumulate charges by a current output from the transconductor; and
a chopper circuit which is located at a front-end or a rear-end of the transconductor and removes a low frequency noise.

* * * * *